United States Patent [19]
Crumley

[11] Patent Number: 5,008,897
[45] Date of Patent: Apr. 16, 1991

[54] WATER COOLED CRUCIBLE

[75] Inventor: Gary B. Crumley, Oakland, Calif.

[73] Assignee: The BOC Group, Inc., Murray Hill, N.J.

[21] Appl. No.: 498,869

[22] Filed: Mar. 23, 1990

[51] Int. Cl.$^5$ ............................................. H01J 37/305
[52] U.S. Cl. ........................................ 373/11; 373/10; 373/16; 219/121.15
[58] Field of Search ......................... 373/10, 11, 12–15, 373/16, 17, 74, 76, 113, 72; 219/420, 271, 121.15

[56] References Cited

U.S. PATENT DOCUMENTS

| | | | |
|---|---|---|---|
| 3,554,512 | 1/1971 | Elliott | 219/420 |
| 4,304,396 | 12/1981 | Udoh | 373/76 |
| 4,866,239 | 9/1989 | Egermeier | 373/11 |

*Primary Examiner*—Bruce A. Reynolds
*Assistant Examiner*—Tu Hoang
*Attorney, Agent, or Firm*—Robert I. Pearlman; David M. Rosenblum

[57] ABSTRACT

The present invention provides a water cooled crucible adapted to be received in a crucible support element of an electron beam evaporation system. The crucible comprises a base wall and a sidewall upstanding from the base wall to form a rim and pocket located between the rim and the base wall for containing molten material to be evaporated. The support element has an inner surface surrounding the sidewall of the crucible to define an annular passage for circulating cooling water in a direction taken from the rim to the base wall of the crucible. The sidewall includes a thickened region positioned to conduct heat generated at the top surface of the molten material and having a thickness such that the outer surface contacts the inner surface of the support element. The thickened region has a plurality of circumferentially spaced, preferably spiral grooves defined at the outer surface of the thickened region. The grooves have a total inner surface area greater than the area of contact between the outer surface of the thickened region and the inner surface of the support element to increase the heat transfer between the sidewall and cooling water in order to prevent the onset of wetting.

5 Claims, 2 Drawing Sheets

WATER COOLED CRUCIBLE

BACKGROUND OF THE INVENTION

The present invention relates to a water cooled crucible for use in an electron beam evaporation source. In an electron beam evaporation source, an electron beam, produced by an electron beam gun, is directed at a material contained within the water cooled crucible. The electron beam melts and vaporizes the material in order to deposit the material onto a substrate. In one type of electron beam evaporation source, the electron beam gun is mounted beneath the crucible and a magnetic field produced by permanent magnets bends the electron beam through an arc of 270° and into the crucible.

Electron beam guns have an output rating of anywhere from 10 to 12 kw. In order to keep the crucible from melting, water passages are provided within a supporting structure that supports the crucible. Such supporting structure can comprise a shell-like outerwall and a shell-like baffle plate coaxially spaced within the outerwall. The crucible is received within the baffle plate with an overhanging, under-stepped, rim portion of the crucible resting on the top of the outerwall. The resultant outer annular space located between the baffle plate and the outer wall form an inlet passage for the cooling water. The cooling water flows from the outer annular space through openings in the baffle plate, located near the rim of the crucible, into an inner annular space located between the crucible sidewall and the baffle plate.

Although electron beam sources are capable of processing virtually all elements or combination of elements in the periodic table, the melting and evaporating aluminum and aluminum alloys is extremely difficult due to the high thermal conductivity of the aluminum. As the electron beam impacts the top surface of the aluminum in the crucible, a certain portion of the heat is transferred to the aluminum to melt and evaporate the aluminum. Another portion of the heat is conducted through the crucible sidewall and into the cooling water. An event referred to in the art as "wetting" occurs when the aluminum and the crucible, generally fabricated from copper, alloy. In the wetting phenomenon, the aluminum melts into the crucible at a location of the crucible at or near the top surface of the molten material. Initiation of the wetting phenomenon is not fully understood. However, once initial wetting occurs between the aluminum and copper of the crucible, the thermal conductance across the interface increases. The increase in thermal conductance produces local boiling of the cooling water in the inner annular space and forms a steam pocket. Once the steam pocket forms, heat transfer between the cooling water and the region of the crucible at or near the steam pocket eventually stops. The end result of the loss of cooling causes catastrophic failure of the crucible.

The present invention provides a water cooled crucible having a greater outer surface area than water cooled crucibles of the prior art to increase heat transfer between the crucible and the cooling water at the top surface of the molten material and thereby prevent the wetting phenomenon.

SUMMARY OF THE INVENTION

The present invention provides a water cooled crucible adapted to be received in a crucible support element of an electron beam evaporation system. The crucible comprises a base wall and a sidewall upstanding from the base wall to form a rim and pocket located between the rim and the base wall for containing molten material to be evaporated. The support element has an inner surface surrounding the sidewall of the crucible to define an annular passage for circulation of cooling water in a direction taken from the rim to the base wall of the crucible. The sidewall includes a thickened region positioned to conduct heat generated at the top surface of the molten material. The thickened region has a thickness such that the outer surface of the thickened region contacts the inner surface of the crucible support element Additionally, the thickened region has a plurality of circumferentially spaced grooves defined at the outer surface of the thickened region for passage of the cooling water. The circumferentially spaced grooves have a total inner surface area greater than the area of contact between the outer surface of the thickened region and the inner surface of the crucible support element to increase heat transfer between the cooling water and the sidewall of the crucible. The greater heat transfer between the crucible sidewall and the cooling water at the top surface of the molten material resists the production of the wetting phenomenon discussed above in case the material has a high thermal conductivity and is capable of alloying with sidewall of the crucible. For instance, as discussed above, aluminum is capable of alloying with a crucible formed from copper.

BRIEF DESCRIPTION OF THE DRAWINGS

While the specification concludes with claims particularly pointing out the subject matter that Applicant regards as his invention, it is believed that the invention will be better understood from the following description taken in conjunction with the accompanying drawings in which:

DETAILED DESCRIPTION OF THE INVENTION

Figure 1:
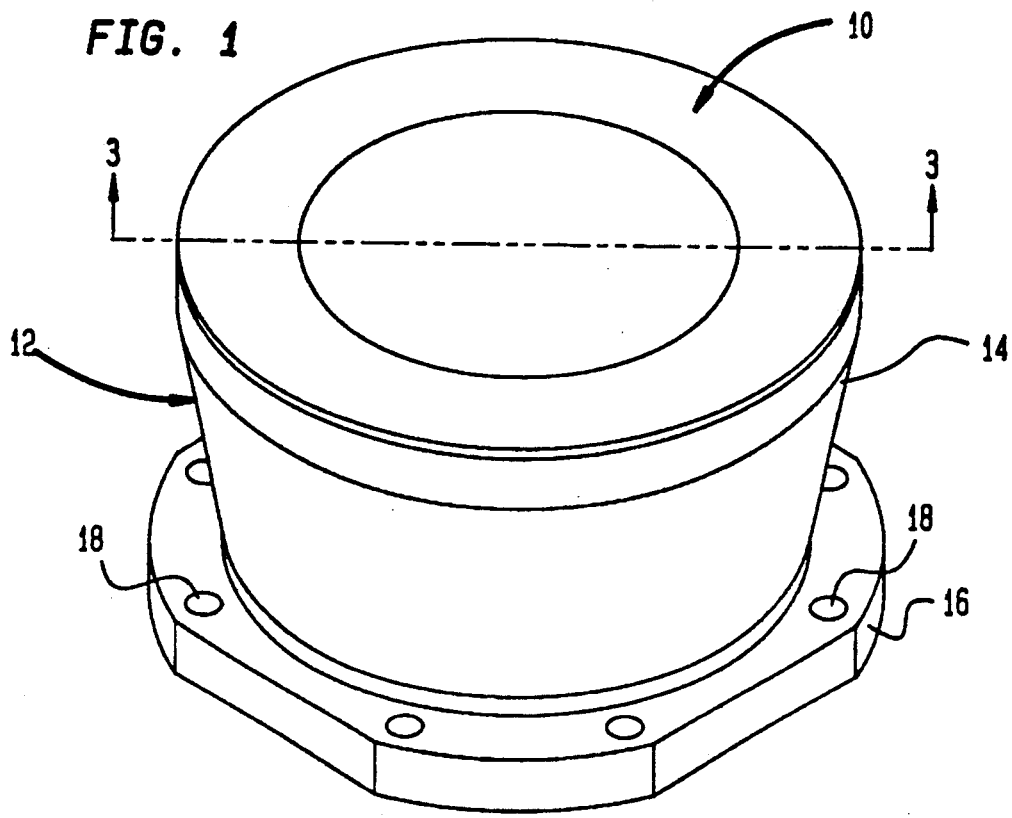
FIG. 1 is a perspective view of a crucible support element of an electron beam evaporation source containing a water cooled crucible in accordance with the present invention.
Figure 2:
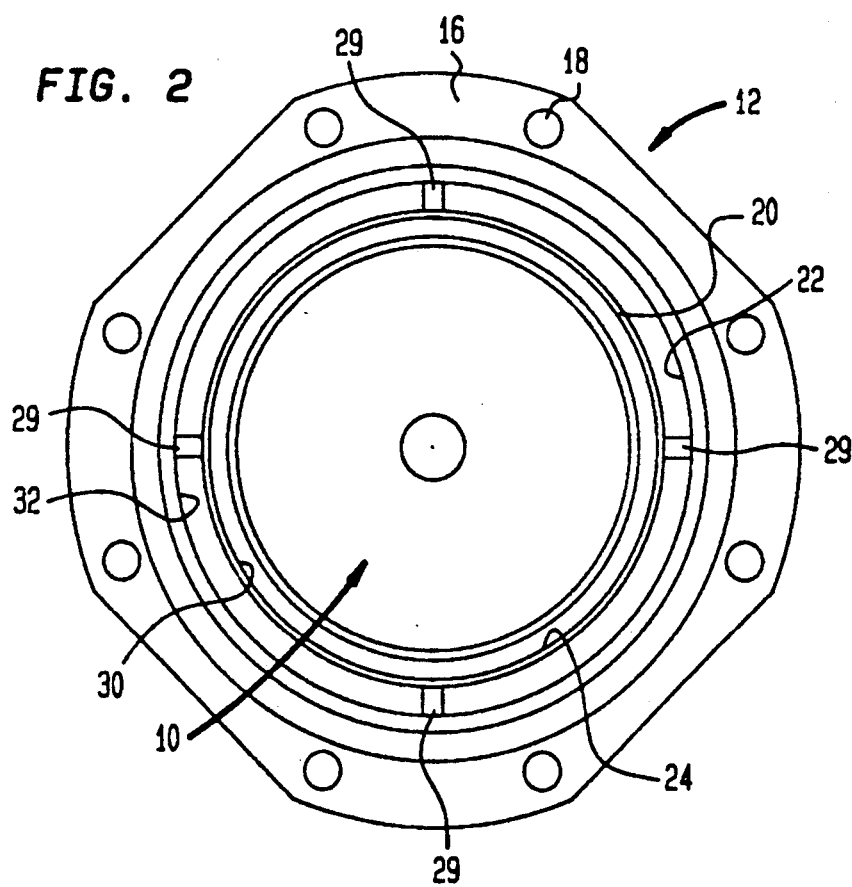
FIG. 2 is a bottom plan view of FIG. 1.
Figure 3:
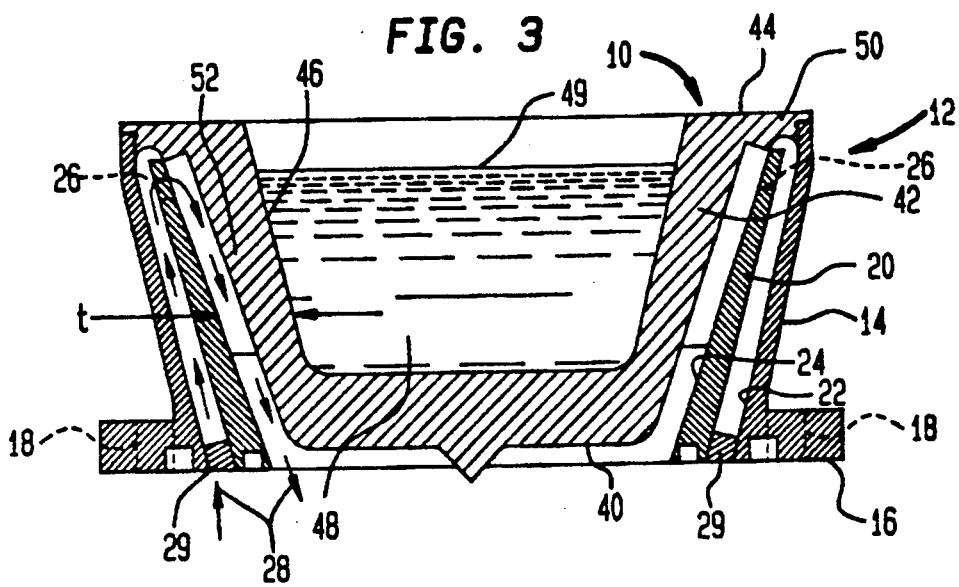
FIG. 3 is a cross-sectional view of FIG. 1 taken along line 3—3.

With reference to FIGS. 1–3, a preferred water cooled crucible 10 is illustrated in a mounted position within a support element 12. Support element 12 is designed to be connected by a set of threaded fasteners to a carousel of a well-known electron beam evaporation system manufactured by TEMESCAL, an operating unit of Edwards High Vacuum International, which in turn is a division of The BOC Group, Inc., the Assignee herein. A description of the entire electron beam evaporation system, including the support element, such as support element 12, may be found in U.S. Pat. No. 4,866,239. The description and drawings of the electron beam evaporation source of U.S. Pat. No. 4,866,239 are hereby incorporated by reference.

Support element 12 comprises an outer wall 14 and a bottom flange 16 having a set of 8 bores 18 for receiving a set of threaded fasteners that are used to attach support element 12 to the carousel of the electron beam evaporation source. Support element 12 also includes a shell-like baffle plate 20 forming an outer annular passage 22 for receiving cooling water and an inner annular passageway 24 for circulating the cooling water on the outside of the crucible. Communication is provided between inner and outer annular passageways 22 and 24 by a set of passageways 26 located at the top of baffle plate 20. The flow direction of the cooling water is indicated by arrowheads 28. Baffle plate 20 is connected at its bottom to bottom flange 16 by provision of a set of 4 welds designated by reference numeral 29.

Baffle plate 20 forms a pair of concentric inner and outer apertures 30 and 32 at the bottom of bottom flange 16. Inner and outer apertures 30 and 32 are of annular configuration. When bottom flange 16 is connected to the carousel of an electron beam evaporation source by the set of threaded fasteners, inner aperture 30 and outer aperture 32 align with passageways in the carousel that conduct the cooling water into outer aperture 32 and outer passageway 22 and out of inner annular passageway 24 and outer aperture 32.

Water cooled crucible 10 has a base wall 40 and a sidewall 42 upstanding from base wall 40 to define a rim portion 44 at the top of crucible 10 and a pocket 46 between rim 44 and base wall 40 for containing molten material 48 to be evaporated by an electron beam. Rim 44 has an under-stepped shoulder portion 50 that contacts the top of outer wall 14 of support element 12 and rests against the top of baffle plate 20. Preferably, crucible 10 is not connected to support element 12 and may be removed for replacement.

Figure 4:
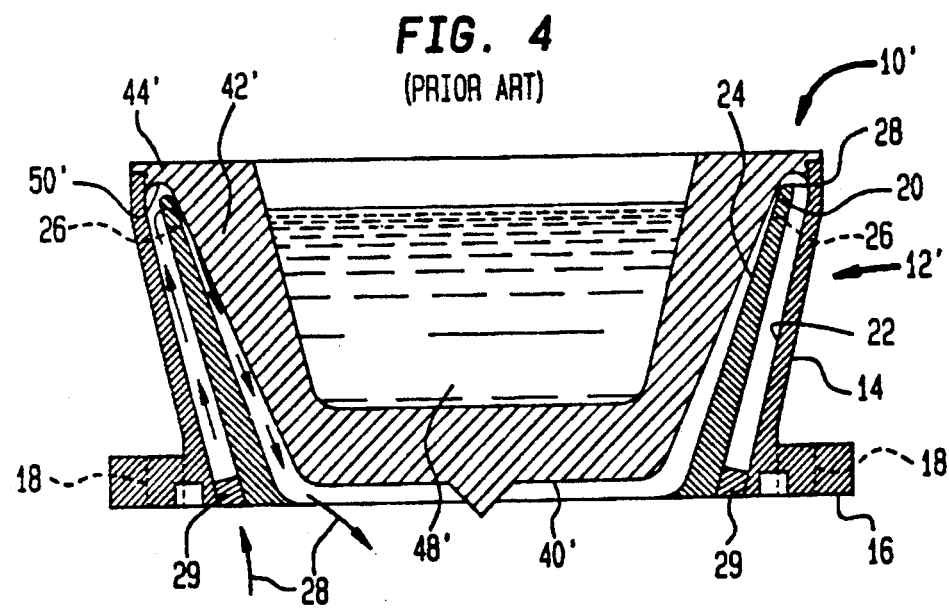
FIG. 4 is a cross-sectional view of a prior art water cooled crucible and support element.

The prior art water cooled crucible 12' illustrated in FIG. 4 has a base wall 40', an upstanding sidewall 42' and a rim portion 44' having a under-stepped shoulder portion 50'. When molten material 48' comprises aluminum, the wetting phenomenon, discussed above, occurs at or near the top surface of molten material 48'. The resulting alloying of the aluminum with sidewall 42' produces steam bubbles in inner annular passageway 24 beneath rim portion 44'.

Figure 5:
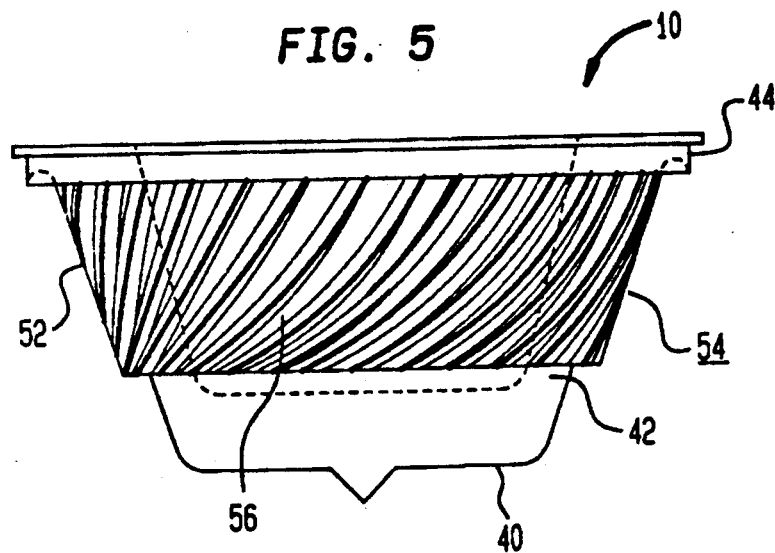
FIG. 5 is an elevational view of a water cooled crucible in accordance with the present invention.

With additional reference to FIG. 5, crucible 10 resists such wetting phenomenon by the presence of a thickened region 52 located between rim portion 44 and base wall 40. Thickened region 52 has an outer surface and a thickness 't' such that the outer surface contacts the inner surface of baffle plate 20. A plurality of radially spaced grooves 56 are defined at the outer surface of thickened region 52 to allow passage of the cooling water. Grooves 56 are preferably of spiral configuration; and each of the grooves has a square transverse cross-section. In this regard, in the preferred embodiment grooves 56 are formed by a milling operation so that each groove is a right hand helix spaced about 12 degrees apart from the next adjacent groove and complete at about 45 degrees of revolution of crucible 10. Moreover each groove is about 3.202 mm. wide by about 3.202 mm. deep. The total internal area of the grooves is greater than the area of contact of the outer surface of thickened region 52 with the inner surface of baffle plate 20 and thus, the total surface area of sidewall 42 is greater than that up sidewall 42 of the prior art crucible 10'.

As mentioned previously, the wetting phenomena occurs near the top surface 49 of material 48. The reason for this is that the electron beam impinges on material 48 at this point. Thus, thickened region 52 is positioned to conduct heat at the top surface of material 48; and the increased surface area of the thickened region 52 is supplied near the hottest region of crucible 10, where the wetting phenomena would be expected to occur. As may be appreciated, the increased surface area allows for greater heat transfer between sidewall 42 of crucible 10 and the cooling water. This greater heat transfer in the top of crucible 10 lowers the temperature of sidewall 42 over conventional prior art crucibles such as designated herein by reference numeral 10' and provides greater cooling to inhibit the initiation of the wetting phenomena.

Although an embodiment in accordance with the present invention could be provided with grooves of straight configuration that run in a vertical direction, and/or have a semicircular transverse cross-section, the total internal area of such grooves would be less than preferred illustrated grooves 56. As may be appreciated, this would result in less heat transfer between the sidewall of such crucible and the cooling water. Additionally, the thickened region could extend beneath rim portion 44 and along the entire length of sidewall 42. This, however, is not necessary in that the wetting phenomena does not occur below the level of the top surface 49 of molten material 48. Moreover, such a possible embodiment would be more complex to design and manufacture because crucible 10 is of frustro-conical configuration and thus, the width of the grooves would have to decrease toward the base wall in order to prevent the grooves from intersecting near the base wall.

While preferred embodiments in the invention have been shown and described in detail, it will be readily understood and appreciated by those skilled in the art that numerous omissions, changes and additions may be made without departing from the spirit and scope of the invention.

I claim:

1. In a water cooled crucible for use in an electron beam evaporation system to contain a material to be melted and evaporated, the water cooled crucible including: a base wall; a sidewall upstanding from the base wall; a rim formed at the top of the sidewall; and a pocket laterally defined by the sidewall and at the top and bottom by the rim and the base wall, respectively; the material contained within the pocket and having, a top surface spaced below the rim, a high thermal conductivity, and a capability of alloying with the sidewall when melted and evaporated; and the electron beam evaporation system including, means for generating an electron beam for melting and evaporating the material at the top surface of the material, the electron beam generating heat at the top surface of the material, conducted through the material to the sidewall, and a crucible support element to receive the crucible and having an inner surface surrounding the sidewall and outwardly spaced therefrom to form an annular passageway for receiving cooling water in a direction taken from the rim to the base wall for cooling the crucible by transferring the heat from the sidewall to the cooling water; the improvement comprising: the sidewall including a region extending from the rim to a location of the sidewall situated beneath the top surface of the material; the sidewall, within the region, having a thickness such that the sidewall contacts the inner surface of the crucible support element, and a plurality of circumferentially spaced grooves defined in the outer surface of the sidewall for allowing passage of the cooling water and configured to increase the heat transfer between the sidewall and the cooling water and thus, the cooling of the sidewall to prevent the material from alloying with the sidewall.

2. The improvement of claim 1, wherein the circumferentially spaced grooves are of spiral configuration.

3. The improvement of claim 2, wherein each of the circumferentially spaced grooves has a square, transverse cross-section.

4. The improvement of claim 2, wherein:

the crucible is frusto-conical configuration; and
the region and the circumferentially spaced grooves extend between the rim and the base wall of the crucible.

5. The improvement of claim 4, wherein:
the rim has an understepped portion; and
the region and the circumferentially spaced grooves extend from directly beneath the overhanging, understepped portion of the rim to the base wall.

* * * * *